US009821325B2

(12) United States Patent
Weierstall et al.

(10) Patent No.: US 9,821,325 B2
(45) Date of Patent: Nov. 21, 2017

(54) APPARATUS AND METHODS FOR LIPIDIC CUBIC PHASE (LCP) INJECTION FOR MEMBRANE PROTEIN INVESTIGATIONS

(71) Applicant: ARIZONA BOARD OF REGENTS on behalf of ARIZONA STATE UNIVERSITY, Scottsdale, AZ (US)

(72) Inventors: Uwe Weierstall, Phoenix, AZ (US); John Spence, Tempe, AZ (US); R. Bruce Doak, Tempe, AZ (US)

(73) Assignee: Arizona Board of Regents on Behalf of Arizona State University, Scottsdale, AZ (US)

( * ) Notice: Subject to any disclaimer, the term of this patent is extended or adjusted under 35 U.S.C. 154(b) by 209 days.

(21) Appl. No.: 14/780,766

(22) PCT Filed: Apr. 28, 2014

(86) PCT No.: PCT/US2014/035627
§ 371 (c)(1),
(2) Date: Sep. 28, 2015

(87) PCT Pub. No.: WO2014/179193
PCT Pub. Date: Nov. 6, 2014

(65) Prior Publication Data
US 2016/0051995 A1 Feb. 25, 2016

Related U.S. Application Data

(60) Provisional application No. 61/817,379, filed on Apr. 30, 2013.

(51) Int. Cl.
*B05B 1/02* (2006.01)
*B05B 1/10* (2006.01)
(Continued)

(52) U.S. Cl.
CPC .................. *B05B 1/10* (2013.01); *B05B 1/02* (2013.01); *B05B 7/064* (2013.01); *B05B 7/066* (2013.01);
(Continued)

(58) Field of Classification Search
CPC  B05B 1/02; B05B 1/10; B05B 7/0416; B05B 7/066; B05B 7/068; B05B 7/08; B05B 7/0815; B05B 7/24
See application file for complete search history.

(56) References Cited

U.S. PATENT DOCUMENTS 4,071,195 A  1/1978  Kuhns et al.
4,358,302 A  11/1982  Dahneke et al.
(Continued)

FOREIGN PATENT DOCUMENTS

EP  0647429  4/1995
JP  2003331776  11/2003
(Continued)

OTHER PUBLICATIONS

Shapiro D.A et al, "Powder diffraction from a continuous microjet of submicrometer protein crystals", Journal of Synchrotron Radiation, vol. 15, pp. 593-599, 2008.
(Continued)

*Primary Examiner* — Ryan Reis
(74) *Attorney, Agent, or Firm* — McDonnell Boehnen Hulbert & Berghoff LLP (57) ABSTRACT

An injector apparatus and methods for use, where the injector apparatus comprises: (a) hydraulic stage having first and second ends and including a housing defining a cavity, a primary plunger disposed in the cavity and a secondary plunger, (b) a pressurization system coupled to the hydraulic stage's first end, where the primary plunger is in fluid communication with the pressurization system and is in
(Continued)

mechanical communication with the secondary plunger, (c) a reservoir bore defined in the hydraulic stage housing and configured to receive the primary plunger's second end, where the secondary plunger is disposed within the reservoir bore and (d) a nozzle assembly including a housing, a gas tube and a nozzle capillary, where the nozzle capillary is partially disposed in and is substantially coaxial with the gas tube, where the nozzle capillary's first end is in fluid communication with the reservoir bore's second end.

21 Claims, 8 Drawing Sheets

(51) Int. Cl.

| | | |
|---|---|---|
| *B05B 7/06* | (2006.01) | |
| *B05B 7/08* | (2006.01) | |
| *C30B 7/00* | (2006.01) | |
| *C30B 29/58* | (2006.01) | |
| *B05B 7/24* | (2006.01) | |
| *C30B 7/02* | (2006.01) | |

(52) U.S. Cl.
CPC .................. *B05B 7/08* (2013.01); *B05B 7/24* (2013.01); *C30B 7/00* (2013.01); *C30B 7/02* (2013.01); *C30B 29/58* (2013.01)

(56) References Cited

U.S. PATENT DOCUMENTS

| | | | |
|---|---|---|---|
| 4,794,086 A | 12/1988 | Kasper et al. | |
| 5,423,964 A | 6/1995 | Smith et al. | |
| 5,464,157 A | 11/1995 | Bourdoulous et al. | |
| 5,725,154 A * | 3/1998 | Jackson .................. | B08B 3/026 239/135 |
| 5,735,468 A | 4/1998 | Casey | |
| 5,848,751 A | 12/1998 | Wang et al. | |
| 5,962,606 A | 10/1999 | Williams et al. | |
| 6,166,379 A * | 12/2000 | Montaser ............. | G01N 21/714 219/121.5 |
| 6,386,463 B1 | 5/2002 | Ganan-Calvo et al. | |
| 6,478,240 B1 | 11/2002 | Dorkin et al. | |
| 6,554,202 B2 * | 4/2003 | Ganan-Calvo .... | A61M 15/0065 239/371 |
| RE38,281 E * | 10/2003 | Tisone .................. | B01L 3/0265 118/305 |
| 6,659,365 B2 | 12/2003 | Gipson et al. | |
| 7,482,166 B2 | 1/2009 | Nollert et al. | |
| 8,272,576 B2 | 9/2012 | Doak et al. | |
| 2001/0010206 A1 | 8/2001 | Bryning | |
| 2002/0179737 A1* | 12/2002 | Ryser .................... | B01L 3/0268 239/418 |
| 2003/0132311 A1* | 7/2003 | Dorendorf ............ | B05B 7/0416 239/302 |
| 2003/0209666 A1 | 11/2003 | Hirabayashi et al. | |
| 2004/0163730 A1* | 8/2004 | Olson .................... | B01L 3/0206 141/130 |
| 2007/0158469 A1 | 7/2007 | Burgener | |
| 2007/0295835 A1 | 12/2007 | Pommersheim | |
| 2010/0243753 A1* | 9/2010 | Doak .................... | B05B 7/0475 239/11 |
| 2013/0313336 A1 | 11/2013 | Doak et al. | |
| 2014/0263693 A1 | 9/2014 | Doak et al. | |

FOREIGN PATENT DOCUMENTS

| | | |
|---|---|---|
| JP | 2005296874 | 10/2005 |
| JP | 2007534470 | 11/2007 |
| JP | 2009168785 | 7/2009 |
| WO | 96/21516 | 7/1996 |
| WO | WO 99/30812 | 6/1999 |
| WO | WO 99/30831 | 6/1999 |
| WO | WO 99/30832 | 6/1999 |
| WO | WO 99/30833 | 6/1999 |
| WO | WO 99/30834 | 6/1999 |
| WO | WO 99/30835 | 6/1999 |
| WO | WO 99/31019 | 6/1999 |
| WO | 0056429 | 9/2000 |
| WO | WO 00/76673 | 12/2000 |
| WO | WO 01/45519 | 6/2001 |
| WO | WO 01/69289 | 9/2001 |
| WO | WO 02/47744 | 6/2002 |
| WO | WO 02/060275 | 8/2002 |
| WO | WO 2005/018817 | 3/2005 |
| WO | 2005079999 | 9/2005 |
| WO | WO 2006/117422 | 11/2006 |
| WO | WO 2009/091416 | 7/2009 |

OTHER PUBLICATIONS

Howells M et al, "An assessment of the resolution limitation due to radiation-damage in X-ray diffraction microscopy", Journal of Electron Spectroscopy and Related Phenomena, vol. 170, Issue 1-3, pp. 4-12, 2009.
Ganan-Calvo A.M et al, "Generation of steady liquid microthreads and micron-sized monodisperse sprays in gas", Physical Review Letters, vol. 80, Issue 2, pp. 285, 1998.
Deponte D.P. et al, "Gas dynamic virtual nozzle for generation of microscopic droplet streams", Journal of Physics D: Applied Physics, vol. 41, Issue 19, pp. 1-7, 2008.
Ganan-Calvo A et al, "Focusing capillary jets closet to the continuum limit", Nature Physics, vol. 3, Issue 10, pp. 737-742, 2007.
International Search Report for PCT/US2012/065788, dated Jun. 21, 2013.
Deponte DP et al., "Towards ETEM serial crystallography: Electron diffraction from liquid jets", Ultramicroscopy, vol. 111, No. 7, pp. 824-827, 2011.
Hunter MS et al., "X-ray Diffraction from Membrane Protein Nanocrystals", vol. 100, Issue 1, Jan. 5, 2011, pp. 198-206.
Sharma R, "An environmental transmission electron microscope for in situ synthesis and characterization of nanomaterials", J. Mater. Res., vol. 20, No. 7, Jul. 2005, 1695-1701.
Lagrange T et al., "Nanosecond time-resolved investigations using the in situ of dynamic transmission electron microscope (DTEM)", Ultramicroscopy 108 (2008) 1441-1449.
Taylor KA et al., "Electron Microscopy of Frozen Hydrated Biological Specimens", Journal of Ultrastructureresearch 55, 448-456 (1976).
Unwin PNT et al., "Molecular structure determination by electron microscopy of unstained crystalline specimens", Journal of Molecular Biology 94 (1975) 425-432.
Clark GNI et al., "The structure of ambient water", Molecular Physics, vol. 108, No. 11, Jun. 10, 2010, 1415-1433.
Rayleigh L, "On the instability of jets", Proceedings of the London Mathematical Society s1-10 (1878) 4-13.
International Search Report for PCT/US2014/025249, dated Aug. 26, 2014.
International Search Report for PCT/US2014/035627, dated Sep. 9, 2014.
Weierstall U et al., "Lipidic cubic phase injector facilitates membrane protein serial femtosecond crystallography", Nat Commun. 2014; 5: 3309.
Weierstall U et al., "Injector for scattering measurements on fully solvated biospecies", Review of Scientific Instruments 83, 035108 (2012).
Japanese Search Report for Japanese application No. 2015542545, dated Oct. 4, 2016.
Australian Examination Report for Australian application No. 2012340120, dated Oct. 7, 2016.
European Search Report for PCT application No. PCT/US2014/035627, dated Nov. 29, 2016.

* cited by examiner

Table 1 | Data collection and refinement statistics.

| | SMO/cyclopamine |
|---|---|
| *Data collection* | |
| Space group | P2₁ |
| Cell dimensions | |
| a, b, c (Å) | 40.5, 157.3, 52.4 |
| α, β, γ (°) | 90.0, 97.0, 90.0 |
| Resolution (Å) | 40–3.20 (3.26–3.20)* |
| $R_{pim}$ (%) | 9.8 (63.2) |
| I/σ(I) | 7.4 (1.8) |
| CC | 0.9991 (0.26) |
| Completeness (%) | 100 (100) |
| Multiplicity | 2.315 (1.820) |
| | |
| *Refinement* | |
| Resolution (Å) | 40–3.20 |
| Anisotropic truncation (Å) | 3.4, 3.2, 4.0 |
| No. reflections/test set | 8,082/399 |
| $R_{work}/R_{free}$ | 0.232/0.278 |
| No. atoms | |
| Protein | 3,389 |
| Cyclopamine | 30 |
| B-factors (Å²) | |
| Wilson B/overall B | 101.6/78.4 |
| Receptor/BRIL | 76.9/83.7 |
| Cyclopamine | 76.3 |
| R.m.s. deviations | |
| Bond lengths (Å) | 0.003 |
| Bond angles (°) | 0.6 |

Abbreviation: SMO, smoothened.
The data set includes diffraction from 61,964 crystals.
*High-resolution shell is shown in parentheses.

APPARATUS AND METHODS FOR LIPIDIC CUBIC PHASE (LCP) INJECTION FOR MEMBRANE PROTEIN INVESTIGATIONS

RELATED APPLICATIONS

This application is a non-provisional of and claims priority to U.S. Provisional Application No. 61/817,379 for Apparatus and Methods for Lipidic Cubic Phase (LCP) Injection for Membrane Protein Investigations, filed Apr. 30, 2013, which is hereby incorporated by reference in its entirety.

STATEMENT OF GOVERNMENT INTEREST

This invention was made with government support under 1120997 awarded by the National Science Foundation. The government has certain rights in the invention.

BACKGROUND

Unless otherwise indicated herein, the materials described in this section are not prior art to the claims in this application and are not admitted to be prior art by inclusion in this section.

Crystallization of membrane proteins in lipidic cubic phase ("LCP") was introduced in 1996. This technique has proven to be crucial for elucidating structural mechanisms of membrane proteins. Success of using LCP for growing highly ordered crystals of challenging human membrane proteins can be attributed to at least two factors. LCP provides a more native-like membrane environment for proteins as opposed to a rather harsh environment associated with detergent micelles. Crystals grown in LCP have type I packing with protein molecules making contacts not only through hydrophilic but also through hydrophobic portions resulting in lower solvent content and better crystal ordering. The LCP crystallization technique yielded high-resolution structures of 38 different membrane proteins contributing 119 total entries to the Protein Data Bank. Structure determination with protein crystals in LCP at 3rd generation synchrotrons is still very challenging, since it is very difficult to grow large crystals in LCP. The crystal size is usually 5-10 micrometers with occasionally 50 micron crystals. Under prior art techniques, in order to determine the structure of protein crystals, the largest crystals have to be extracted and mounted in a sample holder, they are then frozen and exposed to a continuous X-ray beam. Due to the small size of the crystals, the signal obtained is low and radiation damage often terminates the experiment before useful high resolution data has been collected.

SUMMARY OF THE INVENTION

Example embodiments provide improved methods and injector apparatus that may extrude lipidic cubic phase ("LCP") into a micron-sized contiguous stream suitable for injection into either vacuum or ambient gas, for example, and into a probe beam, such as X-ray, electron, ion, or optical photon beam. The protein crystals may be injected in the medium in which they have been grown, which may avoid removal of the crystals from LCP by detergents, which may often lead to crystal destruction. This capability provides an advantage over known injection devices that are not capable of injecting membrane protein crystals that grow only in LCP into a probe beam.

In addition, the injector apparatus may be used to permit serial femtosecond crystallography ("SFX"). For example, the injector apparatus and methods may be used with a probe beam consisting of femtosecond X-ray pulses from a X-ray Free Electron Laser ("XFEL") that may allow the sample to refresh after each probe pulse with no observable radiation damage and that may provide a continuously-renewed microscopic source of material for interrogation. SFX relies on the fact that the duration of the X-ray pulses may be so brief (<50 fs) that diffracted photons may exit the sample before damage initiated by photoionization is able to establish itself. Diffraction may thereby be recorded from essentially undamaged molecules at or close to room temperature. The peak brightness of an XFEL is a billion times higher than that of third generation synchrotrons, allowing collection of high quality single diffraction patterns from individual sub-10-μm-sized crystals in random orientations. By injecting the LCP into the X-ray beam, all of the crystals, even the smallest ones, that are usually discarded, may contribute to the data collection. Since LCP is a frequently used growth medium for human membrane protein crystals, which may not be crystallized in any other liquid (e.g. the family of G-protein coupled receptors), this novel micro-extrusion technique and apparatus may be beneficially utilized in the structure determination of membrane proteins.

Moreover, the LCP utilized in the present methods may have a viscosity of about 500 Pa-sec at 25° C. This high viscosity may advantageously permit a very low flow rate to be achieved, which may beneficially reduce sample waste when used with XFELs. Further, protein crystals in LCP may not settle, as they do in low viscosity liquids like detergents. Therefore, the concentration and distribution of crystal particles in the injected liquid may beneficially remain the same or similar over time. Also, since the crystals grown in LCP may often be too small for known protein crystallography techniques, the present methods and apparatus may enable the structure solution of proteins to be identified that would otherwise go undetermined.

In addition, there are many attendant benefits to the method and injector apparatus for membrane protein crystallography. For example, the native environment of a membrane protein is the lipid bilayer of a cell. To preserve the native conformation of a membrane protein molecule or nanocrystal in aqueous solution, the protein species should be placed in an environment that may not only (1) emulate the lipid bilayer of a cell but that also (2) may allow sufficient mobility such that the intrinsic bioactivity of the protein species may be retained and that (3) may provide an environment in which crystallization of the protein may take place. The lipidic cubic phase that may be provided by the present apparatus and methods may act as a more appropriate medium that meets these three goals than that provided by known techniques, such as solubilization in detergent micelles.

Still further, example apparatus and methods may achieve the same low flow rates ranging from about 10 to about 200 nanoliters/min as known devices, but may perform more reliably, running for hours without intervention. The injector apparatus and methods may also advantageously achieve a low flow rate that may be optimal for the 120 Hz pulse rate of current XFELs. Further, the LCP flow velocity resulting from the injector apparatus and methods may be adjusted to permit the stream or jet emitted from the device to advance only the distance needed to expose fresh sample for the next pulse. In other words, the stream or jet may be advanced such that between X-ray pulses none of the sample material is wasted. This may beneficially permit derivation of a full data set for protein structure determination from only 60 microliters of sample.

The foregoing benefits and advantages may be achieved through injector apparatus and methods configured to provide a continuous column of LCP that may be extruded from a microscopic capillary under the influence of a back pressure. In addition, this extrusion may allow injection of membrane protein nanocrystals into pulsed probe beams (e.g. X-rays, electrons) for structural analysis. Various embodiments may provide a hydraulic pressure amplification stage device that may permit extrusion of the LCP column. In some embodiments, the LCP flow rate may be adjusted from about 0 nl/min to about 200 nl/min by adjusting the back pressure. In further embodiments, coaxial gas flow may be provided to maintain the LCP column in proper alignment for extrusion into the probe beam. In other embodiments, the hydraulic stage may be used in combination with a High Pressure Liquid Chromatography ("HPLC") pump to permit operation at a constant flow rate.

Thus, in one aspect an injector apparatus is provided including (a) a hydraulic stage having a first end and a second end, where the hydraulic stage comprises a housing defining a cavity between the first end and the second end of the hydraulic stage, a primary plunger disposed in the cavity and a secondary plunger, (b) a pressurization system coupled to the hydraulic stage at the first end, where the primary plunger has a first end in fluid communication with the pressurization system and has a second end in mechanical communication with the secondary plunger, (c) a reservoir bore defined in the housing of the hydraulic stage, where the reservoir bore has a first end and a second end, where the first end of the reservoir bore is configured to receive the second end of the primary plunger, where the secondary plunger is disposed within the reservoir bore and (d) a nozzle assembly comprising a housing, a gas tube and a nozzle capillary, where the gas tube has a first end, a second end and a gas aperture defined at the second end of the gas tube, where the nozzle capillary is partially disposed within the gas tube and is substantially coaxial with the gas tube, where the nozzle capillary has a first end and a second end, where the first end of the nozzle capillary is in fluid communication with the second end of the reservoir bore.

In a further aspect, a method for producing a continuous liquid jet is provided including the steps of (a) providing an injector apparatus according to the first aspect of the invention. (b) applying a first pressure to a first end of a primary plunger, (c) applying a second pressure to a solution contained in a reservoir bore. (d) advancing the solution into a first end of a nozzle capillary and simultaneously flowing gas through a gas tube, and (e) advancing the solution out of a second end of the nozzle capillary and simultaneously flowing gas out of a gas aperture defined at the second end of the gas tube.

BRIEF DESCRIPTION OF THE DRAWINGS

FIG. 5 shows photographs of single femtosecond diffraction patterns and LCP extrusion. FIG. 5(b) shows diffraction from serotonin receptor 5-HT$_{2B}$ in cholesterol-doped 9.9 MAG+7.9 MAG LCP. No sharp rings are visible suggesting that formation of $L_c$ phase has been avoided (X-ray intensity attenuated to 3.1% due to strong Bragg diffraction from 5×5×5 μm$^3$ sized crystals, 1.5 μm X-ray beam diameter, 50-fs pulse length, 9.5 keV, 50 μm LCP jet diameter, 190 nl min$^{-1}$ flow rate, 120 Hz pulse rate). The resolution at the detector edge in both panels is 2.5 Å. FIG. 5(c) shows He as the co-flowing gas. Birefringence (bright flecks) is an indication of a transition of the cubic phase to a lamellar crystalline phase due to evaporative cooling. FIG. 5(d) shows N2 as co-flowing gas and no visible birefringence. Scale bars are 100 μm.

FIG. 7(a) shows a receptor model with cyclopamine as a stick model with carbons shown above the top horizontal line, and the 'omit' 2 mF$_o$-DF$_c$ density map for cyclopamine contoured at 1σ is shown as wires. The horizontal lines indicate membrane boundaries. Figure (b) shows cyclopamine binding pocket in stereo view as a stick model alone with 2 mF$_o$-DF$_c$ density map contoured at 1σ. Cyclopamine binds near the entrance into a long and narrow cavity inside the receptor. Polar interactions stabilizing the shape of the cavity and cyclopamine binding are shown as dashed lines. Viewing angles in (a) and (b) are slightly different.

DETAILED DESCRIPTION

Example injector apparatus and methods for producing a continuous liquid jet are described herein. Any example embodiment or feature described herein is not necessarily to be construed as preferred or advantageous over other embodiments or features. The example embodiments described herein are not meant to be limiting. It will be readily understood that certain aspects of the disclosed apparatus and methods can be arranged and combined in a wide variety of different configurations, all of which are contemplated herein.

Furthermore, the particular arrangements shown in the Figures should not be viewed as limiting. It should be understood that other embodiments may include more or less of each element shown in a given Figure. Further, some of the illustrated elements may be combined or omitted. Yet further, an example embodiment may include elements that are not illustrated in the Figures.

As used herein, with respect to measurements, "about" means +/−5%.

Figure 1:
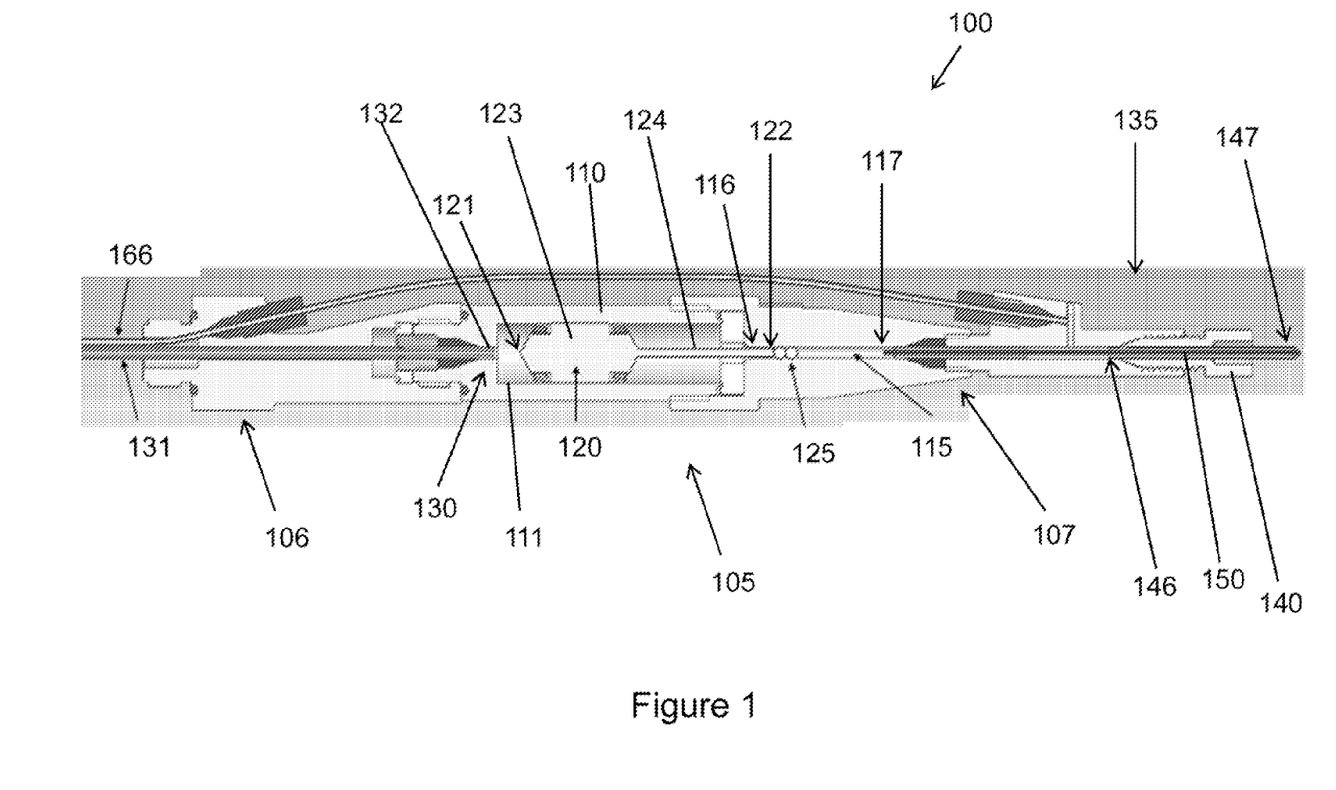
FIG. 1 is a side cross-sectional view of the injector apparatus according to one example embodiment.
Figure 2:
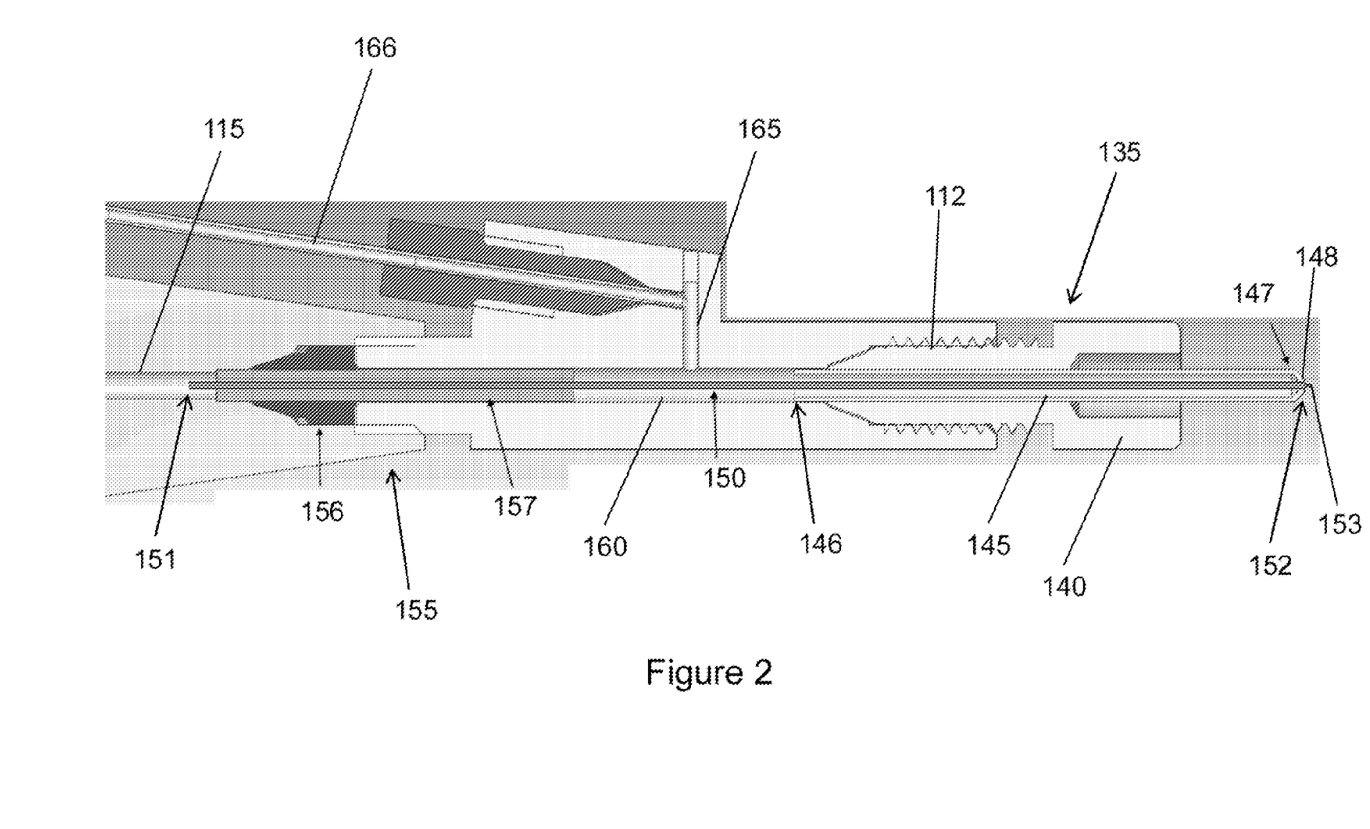
FIG. 2 is a detail side cross-sectional view of the nozzle assembly of the injector apparatus according to the embodiment of FIG. 1.

In one aspect, shown in FIGS. 1 and 2, the invention provides an injector apparatus 100 that includes a hydraulic stage 105 that has a first end 106 and a second end 107. The hydraulic stage 105 may include a housing 110 that defines a cavity 111 between the first end 106 and the second end 107 of the hydraulic stage 105. The hydraulic stage 105 may also include a reservoir bore 115 defined in the second end 107 of the hydraulic stage 105 and arranged adjacent to the cavity 111. The reservoir bore 115 may likewise have a first end 116 and a second end 117. In operation, the reservoir bore 115 may receive LCP for injection. The dimensions of the reservoir bore 115 may be based upon the desired amount of LCP for injection. For example, in various embodiments, the reservoir bore 115 may be configured with an internal volume to accommodate about 10 μl to about 40 μl of LCP. In various embodiments, the reservoir bore 115 may have a diameter in the range from about 1 mm to about 3 mm, and may preferably have a diameter of about 1.3 mm. In one embodiment, the reservoir bore 115 may have precisely machined dimensions and smooth walls.

In one embodiment, a primary plunger 120 may be disposed in the cavity 111. The primary plunger 120 may have a first end 121 and a second end 122, where the first end 121 has a larger diameter than the second end 122. In some embodiments, the first end 121 of the primary plunger 120 may have a diameter ranging from about 5 mm to about 14 mm and may preferably have a diameter of 8 mm. In some embodiments, the second end 122 of the primary plunger 120 may have a diameter ranging from about 1 mm to about 3 mm and may preferably have a diameter of 1.37 mm. In some embodiments, the first end 121 of the primary plunger 120 may be convex, as shown, to assist with mounting a hydraulic seal onto the primary plunger 120 without damaging the seal ring. The primary plunger 120 may be arranged such that the first end 116 of the reservoir bore 115 is axially aligned with and configured to receive the second end 122 of the primary plunger 120. In one embodiment, the primary plunger 120 may have a two segment configuration, where the first segment 123 may have a diameter sized to interface with the walls of the cavity 111 and the second segment 124 may have a diameter sized to interface with the walls of the reservoir bore 115.

In addition, a secondary plunger 125 may be slidably disposed within the reservoir bore and arranged such that the second end 122 of the primary plunger 120 may be in mechanical communication with the secondary plunger 125. For example, in one embodiment, the primary plunger 120 may press directly against the secondary plunger 125, whereas in another embodiment the primary plunger 120 may act upon an intermediary body (not shown) that in turn may act upon the secondary plunger 125. In one embodiment, the secondary plunger 125 may be one or a plurality of Teflon balls 125. In various other embodiments, balls made of nylon or other soft, deformable plastic may be used. In operation, the Teflon balls 125 may seal the reservoir bore 115 to prevent leakage of the LCP into the cavity 111. In one embodiment, the Teflon balls 125 may each have a diameter that is larger than an inner diameter of the reservoir bore 115. In various embodiments, the diameter of the Teflon balls 125 may range from about 1 mm to about 3 mm, and may preferably have a diameter of 1.6 mm. In one preferred embodiment, the diameter of the Teflon balls 125 may be about 1.6 mm and the reservoir bore 115 may have a diameter of about 1.3 mm, such that when the Teflon balls 125 are pressed into the reservoir bore 115, the balls 125 may partially deform into cylinders. In operation, the pressure applied by the primary plunger 120 may deform the Teflon balls 125 further, providing a tight seal against pressures on the LCP in the reservoir bore 115 ranging up to about 10,000 psi. This arrangement advantageously prevents intermixing of water and LCP.

The injector apparatus 100 may also include a pressurization system 130 coupled to the first end of the hydraulic stage 106. The first end 121 of the primary plunger 120 may be in fluid communication with the pressurization system 130. In one embodiment, the pressurization system 130 may include a pressurized water reservoir (not shown) coupled to a first end of a tube 131, where a second end 132 of the tube 131 is in fluid communication with the cavity 111 of the hydraulic stage housing 110. In one embodiment, a pressurized water reservoir may be connected to the hydraulic stage housing 110 with a 1/16 inch outer diameter PEEK line. The pressurized water may act upon the first end 121 of the primary plunger 120 advancing the primary plunger 120 in the cavity 111 toward the reservoir bore 115. In one embodiment, pressurized water may be applied up to a maximum pressure of about 300 psi. The configuration of the primary plunger 120 may permit amplification of this applied pressure by a factor of 34 to achieve a pressure of about 0 psi to about 10,000 psi on the LCP in the reservoir bore 115. The pressure amplification may be equal to the ratio of the squared diameters of the first end to the diameter of the second end of the primary plunger, i.e. $8^2/1.37^2 = 34$, in one embodiment. In other embodiments, the amplification factor may vary based upon the dimensions of the primary and secondary plunger, for example. The amplified pressure may act upon high viscosity LCP disposed in the reservoir bore 115 and may drive the LCP through a nozzle capillary of a nozzle assembly described below. Alternatively, it may be advantageous to work in a constant flow rate mode instead of a constant pressure mode. In embodiments utilizing a constant flow rate, the pressurization system may comprise a High Pressure Liquid Chromatography ("HPLC") pump coupled to a first end of the tube 131, where a second end 132 of the tube is in fluid communication with the cavity 111 of the hydraulic stage housing 110. Constant LCP flow rates ranging from about 5 nl/min to about 200 nl/min may be achieved by adjusting the flow rate value on the HPLC pump and dividing it by the factor 34 or by the relevant amplification factor of a given embodiment.

As shown in FIGS. 1 and 2, the injector apparatus 100 may also include a nozzle assembly 135 that in turn may include a housing 140, a gas tube 145 and a nozzle capillary 150. In one embodiment, a portion of the nozzle assembly housing 140 may have threads that may mate with threads disposed in a cavity 112 at the second end 107 of the hydraulic stage housing 110. In one embodiment, the gas tube 145 may have a first end 146, a second end 147 and a gas aperture 148 defined at the second end 147 of the gas tube 145. In another embodiment, the nozzle capillary 150 may be partially disposed within the gas tube 145 and may be substantially coaxial with the gas tube 145. In a further embodiment, the nozzle capillary 150 may have a first end 151 and a second end 152, and the first end 151 of the nozzle capillary 150 may be in fluid communication with the second end 117 of the reservoir bore 115. In one embodiment, the LCP reservoir bore 115 may be connected to the nozzle capillary 150 having an outer diameter of ranging from about 100 μm to about 400 μm, preferably 360 μm, and having an inner diameter ranging from about 10 μm to about 50 μm. In one embodiment, the nozzle capillary 150 may be made of borosilicate glass, PEEK, Stainless Steel, PTFE, or PFA, among other possibilities, for example. In one embodiment, the length of the nozzle capillary 150 may be kept short to reduce the pressure required to drive the LCP through the nozzle capillary 150. In one embodiment, the length of the nozzle capillary 150 may range from about 1 cm to about 10 cm and is preferably 6 cm long.

Figure 3:
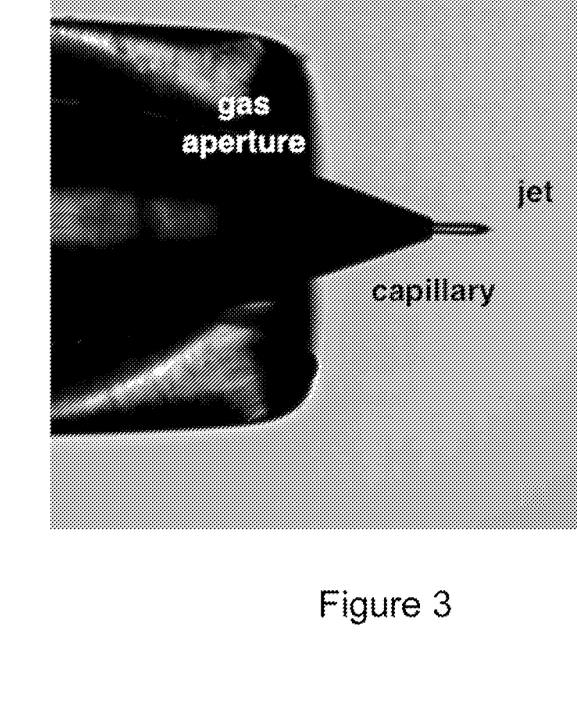
FIG. 3 is a side view of a continuous liquid jet exiting the nozzle capillary that is shown extending from the gas aperture of the gas tube according to one example embodiment.

In operation, the LCP may be extruded out of this nozzle capillary 150 into vacuum or ambient gas. For example, the gas tube 145 may administer a co-flowing gas stream, such as Helium. Nitrogen or Argon, that may used to keep the LCP jet direction straight along the nozzle axis once the LCP exits into the vacuum (or ambient air). The co-flowing gas may prevent the LCP jet from curling and/or from prematurely stopping the jet stream by exerting shear forces onto the LCP jet. Some LCPs with different lipids may not extrude into vacuum without the help of the co-flowing gas, but instead may form a growing drop at the capillary tip, therefore co-flowing gas may be essential in some instances. As shown in FIG. 3, in one embodiment, the nozzle capillary 150 may have a cone tip 153 at the second end 152 and protrude through the gas aperture 148 or extend beyond the second end 147 of the gas tube 145. In one embodiment, the gas tube 145 may be made by melting the end of a glass capillary with a square cross-section and with an inner wall to wall distance ranging from about 100 μm to about 400 μm, for example. The second end 147 of the gas tube 145 may be melted to provide the gas aperture 145 which may have a diameter ranging from about 100 μm to about 300 μm. The length of the square walls may vary with the size of the nozzle capillary 150. In one embodiment, the square cross-section allows gas to travel through the voids formed between the round nozzle capillary 150 and the square walls of the gas tube 145.

In another embodiment, the nozzle assembly of the injector apparatus may define a stabilizing section 155 for the nozzle capillary 150 and a gas flow section 160 in fluid communication with to the gas tube 145. In one embodiment, a HPLC ferrule 156 and sleeve 157, for example, provide the necessary pressure seal at the first end 151 of the nozzle capillary 150 and comprise the nozzle stabilizing section 155. The complete nozzle assembly 135 may be removed to fill the LCP reservoir bore 115 with LCP via a syringe, for example. The coned nozzle capillary protrudes out of the gas aperture. The glass capillary comprising the gas tube 145 may have a square-shaped cross-section with internal walls each having a length of about 400 μm and can be exchanged via a coned HPLC fitting that may be threaded in one embodiment, as shown in FIGS. 1 and 2. In other words, the gas tube may removably attached to the rest of the nozzle assembly. In another embodiment, the gas tube 145 may also have a round cross section and spacers to center the nozzle capillary 150. The centering of the nozzle capillary 150 inside the gas tube 145 is not critical, since the cone 153 at the second end 152 of the capillary 150 protrudes outside the gas tube 150 and any misalignment between the two may not have a significant effect on the LCP jet. In a further embodiment, the housing 140 of the nozzle assembly 135 may define a gas inlet 165 disposed near the first end 146 of the gas tube 145. This gas inlet 165 may be coupled to a gas supply line 166.

Figure 4:
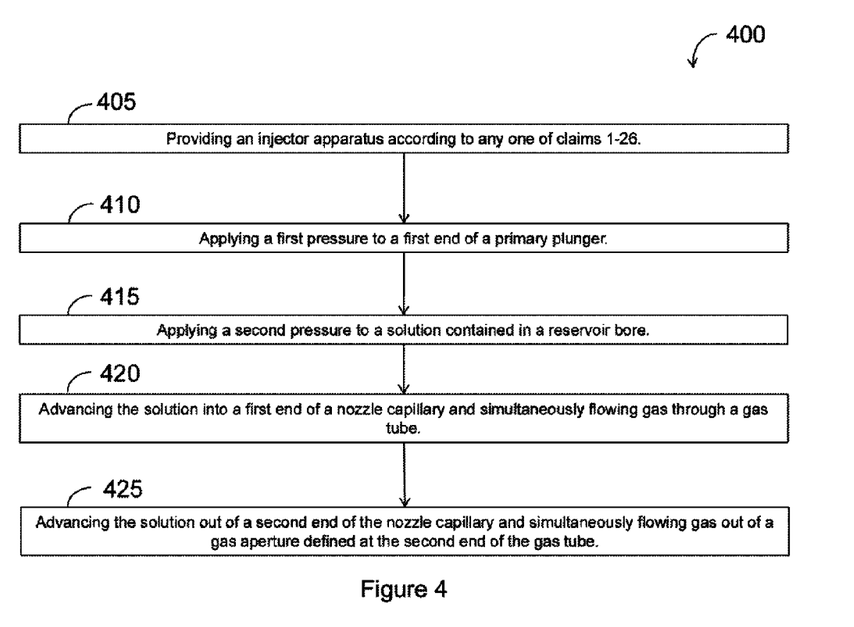
FIG. 4 is a flow chart of a method for producing a continuous liquid jet, according to one example embodiment.

A second aspect of the invention provides a method for producing a continuous liquid jet. An example method is shown in FIG. 4. At block 405, method 400 involves providing a nozzle assembly according to any one of the foregoing embodiments of the first aspect of the invention. At block 410, a first pressure may be applied to a first end of a primary plunger. Then at block 415, a second pressure may be applied to a solution contained in a reservoir bore. At block 420, the solution may be advanced into a first end of a nozzle capillary and gas may simultaneously flow through a gas tube. Next, at block 425, the solution may be advanced out of a second end of the nozzle capillary and gas may simultaneously flow out of an aperture at a second end of the gas tube.

In a further embodiment, the second end of the nozzle capillary and the second end of the gas tube may be placed into a vacuum. In an alternative embodiment, the second end of the nozzle capillary and the second end of the gas tube may be placed into ambient gas.

In yet another embodiment, the solution may advance into a probe beam. In various embodiments, the probe beam may be an X-ray beam, an electron beam, an optical photon beam or an ion beam.

In one embodiment the solution may include a lipidic cubic phase, and the lipidic cubic phase may contain micron-sized membrane protein crystals. In various embodiments, the solution may have a viscosity of about 500 Pa-sec at 25 degrees Celsius.

In additional embodiments, the first pressure applied may range from about 0 psi to about 300 psi. In other embodiments, the second pressure applied may range from about 0 psi to about 10,000 psi. In further embodiments, a pressure amplification may be equal to the ratio of the squared diameter of the first end of the primary plunger to the squared diameter of a second end of the primary plunger.

In still other embodiments, the solution may advance out of the second end of the nozzle capillary at a flow rate ranging from about 5 nl/min to about 200 nl/min.

The methods may be performed at room temperature.

Before operation, the LCP may be introduced into the reservoir bore via a syringe. The nozzle assembly may then be connected to the reservoir via a 10-32 pressure fitting, for example, which may withstand up to 10,000 psi. The LCP flow rate may be adjusted by adjusting the water pressure acting on the primary plunger. In various embodiments, a pressurization system is used to apply pressure to the first end of the primary plunger.

EXAMPLE

Following is the discussion of a method and a device for extruding Lupidic Cubic Phase ("LCP") at slow flow speeds and with extremely low sample consumption as a continuous 10-50 μm diameter stream. The methods and device provide a continuously renewed sample target for interrogation by the femtosecond X-ray beam. The flow speed of the injector is adjustable to the X-ray pulse repetition rate of the X-ray free electron laser ("XFEL"), so that no sample is wasted between shots. LCP-grown microcrystals of the human smoothened (SMO) receptor in complex with cyclopamine have been injected into the femtosecond X-ray beam. Diffraction data from 61,964 microcrystals were merged to recover the structure to 3.2/4.0 Å resolution. The protein consumption was reduced by a factor of 20 compared with serial femtosecond crystallography ("SFX") experiments with a gas dynamic virtual nozzle ("GDVN") as taught in DePonte, D. P. et al. *Gas dynamic virtual nozzle for generation of microscopic droplet streams*. J. PHYS. D. APPL. PHYS, 41, 195505 (2008).

Results

LCP injection. The LCP microextrusion injector (FIG. 1) may include a hydraulic stage, a sample reservoir and a nozzle assembly. The reservoir may hold up to 20 μl of LCP and may be connected to a fused silica capillary having an inner diameter ranging from about 10 μm to about 50 μm. The LCP may be extruded out of this capillary into an evacuated sample chamber and may require a pressure of about 2,000 psi to about 10,000 psi, depending on the nozzle diameter and flow speed. The pressure may be provided by the hydraulic stage that amplifies the applied pressure by a factor of 34. Shear force exerted by a co-flowing gas (helium or nitrogen at about 300 psi to about 500 psi supply pressure) may keep the LCP stream on axis (see Method section below for details).

The LCP flow rate (typically about 1 to about 300 nl min$^{-1}$) depends on the LCP sample composition, nozzle diameter and pressure and may be optimized for the 120 Hz pulse rate of the Linac Coherent Light Source ("LCLS"), so that between X-ray pulses, the stream advances only the distance needed to expose fresh sample to the next pulse, dramatically reducing sample consumption compared with GDVN injection.

Figure 5A:
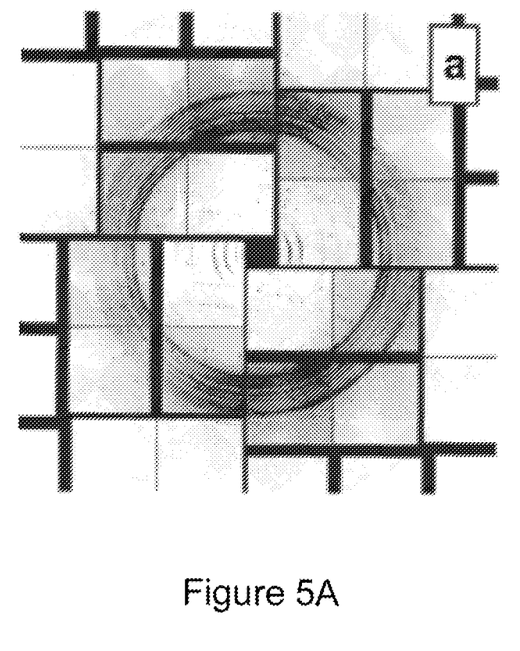
FIG. 5(a) shows diffraction spots from A2A adenosine receptor microcrystals in 9.9 MAG/cholesterol LCP to 2.5 Å and strong powder diffraction rings from crystalline lipid. (X-ray intensity attenuated to 7%, 1.5 μm X-ray beam diameter, 50-fs pulse length, 9.5 keV, 15 μm LCP jet diameter, 300 μl min$^{-1}$ flow rate, 1 Hz pulse rate, crystal size: 1×1×5 μm$^3$).

The most commonly used lipid for crystallization of membrane proteins in LCP is monoolein, 9.9 MAG (an N.T MAG shorthand notation is used for monounsaturated monoacylglycerol lipids, where 'N' is the number of carbon atoms in the acyl chain between the ester and cis-olefinic bonds, and 'T' is the number of carbon atoms between the cis-olefinic bond and the end of the chain). However, this lipid is not ideally suited for the LCP-SFX experiments, as it undergoes a phase transition from the cubic phase to a lamellar crystalline ($L_c$) phase at 18° C. As LCP is injected into an evacuated sample chamber at $\sim 10^{-3}$ Torr and 20° C., evaporative cooling may transform it into the $L_c$ phase, leading to strong, sharp diffraction rings from the $L_c$ phase (see FIG. 5a). This may dramatically increase the background and pose a danger to the detector, which made it necessary to attenuate the LCLS beam by a factor of 20-30. Nonetheless, in initial experiments both microcrystal samples of $\beta_2$ adrenergic receptor ($\beta_2$AR) and adenosine $A_{2A}$ receptor $A_{2A}$AR showed consistent diffraction to $\sim$2.5 Å, even with the highly attenuated beam (FIG. 5a).

Figure 5B:
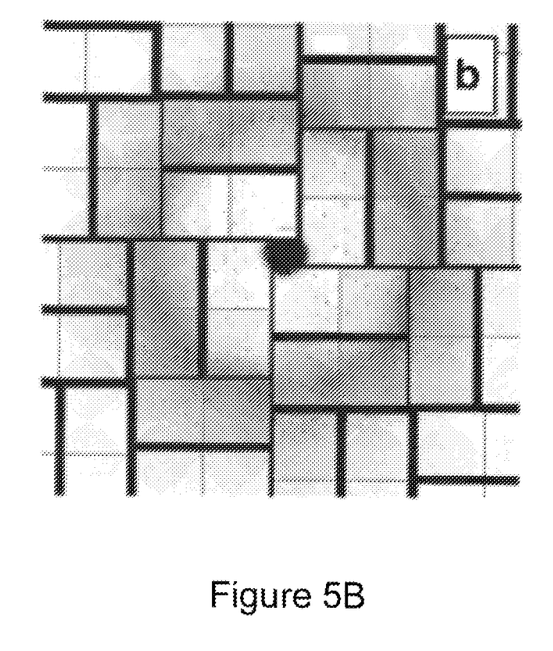
Figure 5C:
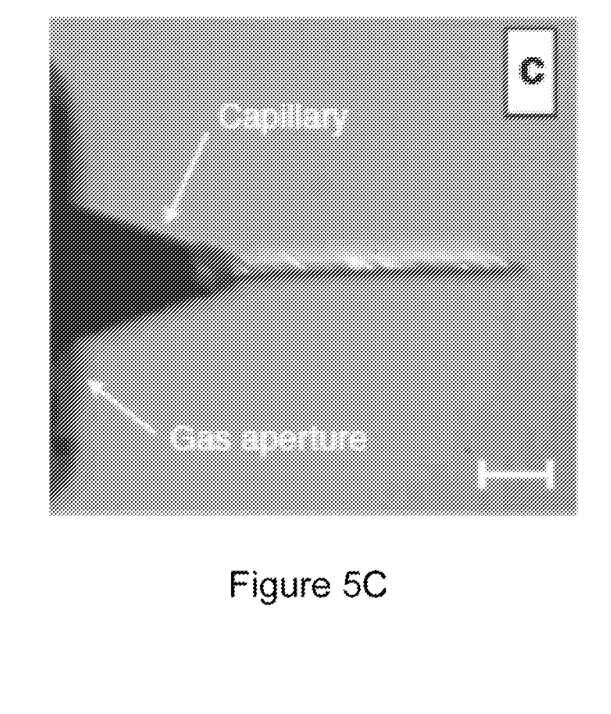
FIGS. 5(c) and 5(d) show 9.9 MAG LCP extrusion in vacuum viewed between crossed polarizers. The tapered end of the capillary nozzle is shown protruding out of the gas aperture, where the capillary has an inner diameter of 30 μm.
Figure 5D:
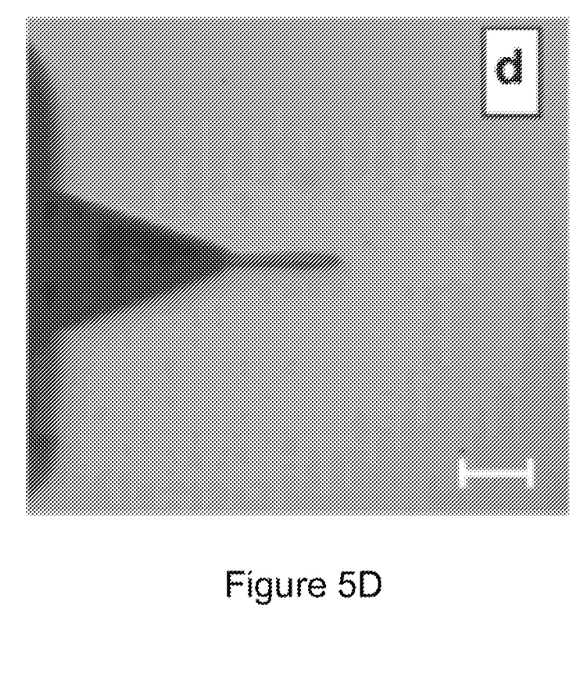

By changing the co-flowing gas from He to $N_2$, the formation of the $L_c$ phase was suppressed but not completely eliminated in the case of LCP prepared with 9.9 MAG (FIGS. 5c, 5d). However, by replacing the 9.9 MAG with shorter chain MAGs (7.9 MAG or 9.7 MAG (monopalmitolein) available from Avanti Polar Lipids), the formation of the $L_c$ phase was completely prevented. Diffraction patterns collected at the LCLS confirmed the presence of the expected cubic-Pn3m phase, without a trace of the $L_c$ phase (FIG. 5b). In addition, for crystals that only grow in 9.9 MAG LCP (the most successful crystallization host lipid to date), the experiments established that 7.9 MAG may be added post crystal growth to prevent formation of the $L_c$ phase upon injection (see Method section for details), which may greatly expand the range of proteins amenable to this method. The high quality of the X-ray diffraction data collected from crystals grown in 9.9 MAG that were delivered in the 7.9/9.9 MAG mixture (FIG. 5b) show that the crystals do not suffer from the addition of 7.9 MAG.

Figure 6:
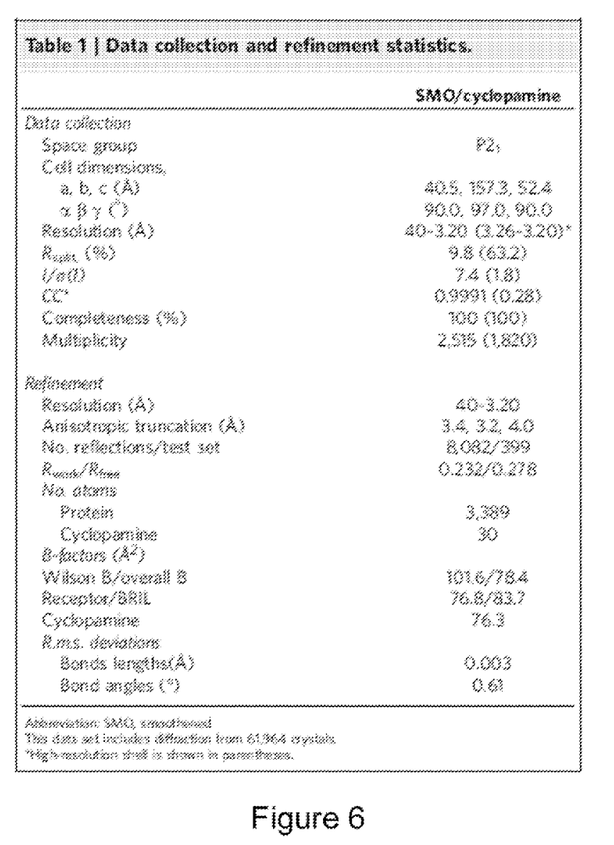
FIG. 6 shows Table 1 providing data collection and refinement statistics for the Example section below.

Diffraction Data and Sample Consumption. Using the LCP injector with a flow rate of 170 nl min$^{-1}$, SFX data were acquired for several G protein-coupled receptors, including $\beta_2$AR, $A_{2A}$AR, SMO, glucagon receptor and serotonin 2B (5-HT$_{2B}$) receptor, as well as the membrane enzyme diacylglycerol kinase (DgkA). Full data sets for SFX structure determination were collected for DgKA, SMO and 5-HT$_{2B}$ over the course of 5-10 h. while using less than 100 μl of each sample (<0.5 mg of protein). This is a vast improvement over typical sample consumption with a GDVN nozzle, which requires 10 ml (10 mg protein) for a complete data set. A comparison of the amounts of sample used in different experiments with the GDVN and the LCP injector is included in Supplementary Table 1 of FIG. 6.

Figure 7:
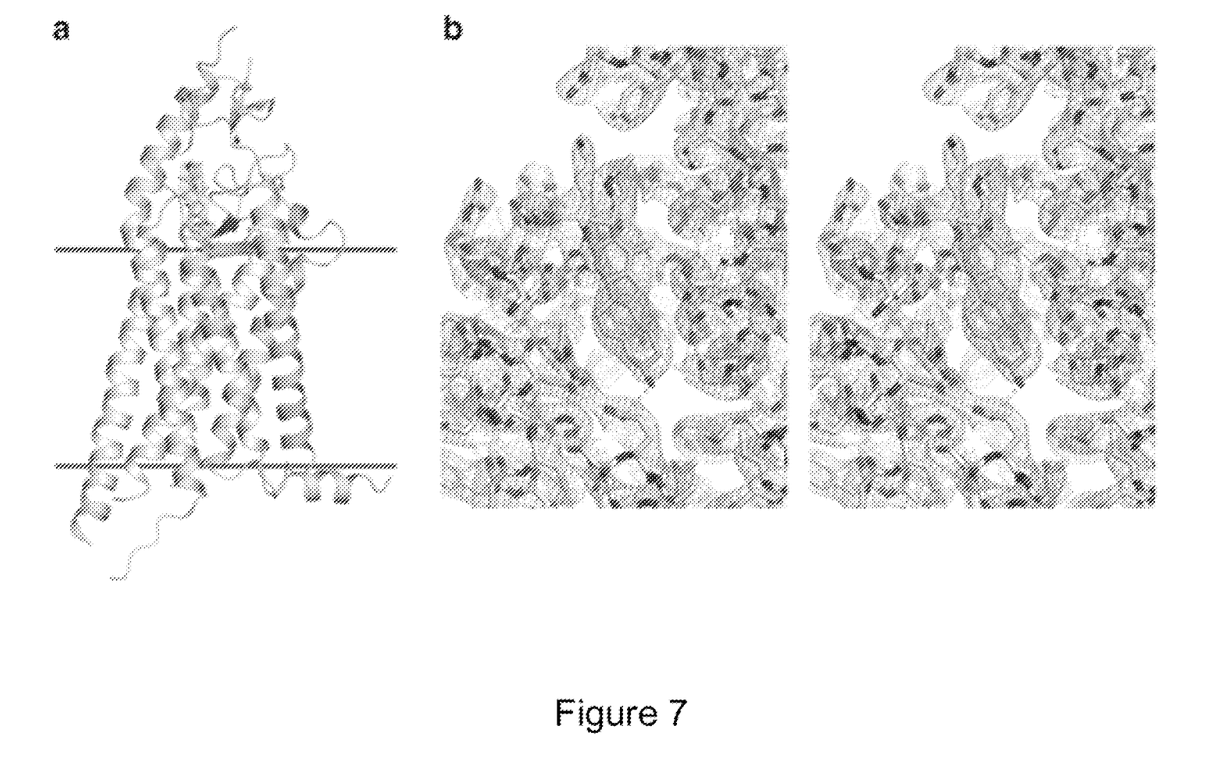
FIG. 7 shows cyclopamine binding to smoothened receptor.

As proof of principle for the newly developed LCP-SFX method, the data collected on human SMO receptor in complex with the naturally occurring teratogen cyclopamine was analyzed. SMO belongs to the class Frizzled of G protein-coupled receptor superfamily, and participates in embryonic development and tumor growth. The first SMO structure in complex with an antagonist LY2940680 was recently determined by traditional microcrystallography at a synchrotron source. However, the analysis proved unsuccessful in solving the structure of the SMO/cyclopamine complex using synchrotron data collected with a 10 μm diameter X-ray beam due to poor diffraction from relatively large crystals ($\sim$120×10×5 μm$^3$), which presumably suffered from accumulation of crystal growth defects or from effects related to cryocooling. The LCP-SFX data collected on sub-5 μm-sized crystals at room temperature were of a reasonable quality to solve the structure by molecular replacement after application of an anisotropic data truncation at 3.4, 3.2 and 4.0 Å along three principal crystal axes (FIG. 6. Table 1). Although the resolution is not very high, the location where the small molecule ligand with an antitumor therapeutic potential binds was able to be confidently identified (FIG. 7).

Discussion

In summary, our successful development of an LCP microextrusion injector allows the beneficial attributes of SFX measurements to be coupled with the unique properties and advantages of LCP for membrane protein crystallization. The new technology not only enables the collection of high-resolution structure data from LCP-grown membrane protein microcrystals at room temperature, but also dramatically reduces the amount of protein required, eliminates the need for laborious crystal size optimization and simplifies crystal handling procedures.

Methods

LCP Injector. The LCP injector, including a hydraulic stage, a sample reservoir and a nozzle, was mounted onto the end of the nozzle rod of an injector designed for XFELs as taught in Weierstall. U., Spenc, J. C. H. & Doak. R. B. *Injector for scattering measurements on fully solvated biospecies*. REV. SCI. INSTRUM. 83, 035108-035108 (2012). The nozzle rod may be removed from the vacuum chamber without compromising the vacuum, allowing for sample reloading and nozzle change. The hydraulic stage may include a syringe body with a sealed solid plunger. The syringe body may have a large bore on the inlet side and a much smaller bore on the outlet side. The ratio of the respective bore areas gives a nominal amplification factor of 34, delivering 10,200 psi to the LCP reservoir when water on the inlet side is pressurized to 300 psi.

The large bore in the syringe body has a diameter of 8 mm. The plunger sliding in this bore has two groves that accept high pressure hydraulic seals (Trelleborg Turcon Variseal) and has a diameter of 8 mm on the water side and an extension with a diameter of 1.37 mm on the LCP side. The plunger extension drives two Teflon beads (Bal-tec) of 1.59 mm outer diameter, which slide in the precision bored 1.37 mm diameter LCP reservoir bore (FIG. 1). The nominal pressure amplification (neglecting frictional forces on the seals) is 34, the ratio of the squared diameters of the bores $(8\ mm)^2\ (1.37\ mm)^{-2}$. The Teflon beads seal the bore of the reservoir against LCP leakage. When the beads are pressed into the slightly smaller reservoir bore, they deform cylindrically. The pressure applied by the plunger deforms them further and thus provides a tight seal for pressures up to 10,000 psi on the LCP.

The 360 μm outer diameter and 10-50 μm inner diameter fused silica capillary tubing (Polymicro) is kept as short as possible (6 cm) to reduce the pressure necessary to extrude the LCP. The nozzle section and the capillary are connected to the reservoir via standard HPLC conical ports (Upchurch with 10-32 threads). The tapered end of the inner capillary is inserted into a flame-polished square outer glass tube and protrudes out of the exit aperture, so that gas may flow through the open corners at a rate adequate for LCP extrusion. The reservoir bore is filled with LCP via a Hamilton syringe and can hold a volume of 20 μl. The Teflon beads are replaced during each sample refill. It is possible to drive the LCP flow in a 'constant pressure' mode via pressurized water connected to the plunger inlet. The supply reservoir for the water is, in turn, pressurized by gas from a gas cylinder and the LCP flow rate is controlled by adjusting the gas pressure. However, in this mode of operation the LCP flow rate would occasionally show sudden jumps (possibly due to wall stick-slip of the LCP), leading to sample loss. Better control over LCP flow was achieved in a 'constant flow rate' mode implemented by using a HPLC pump (Shimadzu LC20AD) to drive the hydraulic liquid (water).

The LCP flow rate can be optimized for the 120 Hz pulse rate of the LCLS so that between X-ray pulses, the stream advances only the distance needed to expose fresh sample to the next pulse. The necessary distance (the 'damage diameter') depends on the X-ray beam diameter and pulse energy. Thus, for example, at an X-ray energy of 9.5 keV, a pulse energy of 50 μJ at the sample and a beam diameter of 1.5 μm, this distance is 10-30 μm. Consequently, for a flow speed where the LCP stream travels 10-30 μm between X-ray pulses (1.2-3.6 mm s$^{-1}$) little, if any, sample is wasted and sample consumption is reduced dramatically compared with GDVN injection. Constant LCP flow rates of 1-300 nLmin$^{-1}$ were achieved by adjusting the flow rate setting on the HPLC pump or by using constant pressure mode (for the lowest flow rates). The minimum usable flow rate is set by the diameter of the LCP stream, the distance that the stream must advance between XFEL pulses, and the X-ray pulse repetition rate (for example, for 120 Hz repetition rate, LCP stream diameter of 15 μm and damage diameter of 20 μm, the minimum usable flow rate is 25 nl min$^{-1}$). The LCP flow rate can be calculated by dividing the HPLC pump flow rate by the pressure amplification factor 34.

GPCR Expression and Purification. Purified GPCR samples ($\beta_2$AR, $A_{2A}$AR, glucagon receptor and 5-HT$_{2B}$) were prepared as follows. Constructs engineered for crystallization were expressed in Sf9 insect cells for 48 h at 27° C. using recombinant baculovirus. Cells were harvested and total membranes were purified by repeated Dounce homogenization and centrifugation in hypotonic and hypertonic buffer. GPCR-ligand complexes were subsequently formed by incubating purified membranes in the presence of ligand, followed by extraction of the complexes in 1% (w/v) N-dodecyl-β-D-maltopyranoside (Anatrace) and 0.2% (w/v) cholesteryl hemisuccinate (CHS, Sigma). Solubilized proteins were purified by immobilized metal affinity chromatography and concentrated to ~20-50 mg ml$^{-1}$.

GPCR Crystallization. Purified protein was reconstituted into LCP by mixing protein solution with molten monoolein (9.9 MAG)/10% (w/w) cholesterol at a volume ratio 2/3 (protein:lipid) using a syringe mixer. Initial crystallization screening was performed using an NT8-LCP robot (Formulatrix) dispensing 40 nl of protein-laden LCP and overlaying it with 800 nl precipitant solution in each well of a 96-well glass sandwich plate (Marienfeld). Plates were stored at 20° C. and periodically imaged in an incubator/imager RockImager 1000 (Formulatrix). Several conditions producing high density of small crystals within 24 h were selected for scaling up.

Crystals for LCP-SFX were obtained in Hamilton gas-tight syringes by injecting ~5 μl of protein-laden LCP as a continuous column of ~400 μm in diameter into a 100 μl syringe filled with 60 μl of precipitant solution and incubated for at least 24 h at 20° C. After crystal formation and removal of excess precipitant solution, ~3 μl of molten 7.9 MAG lipid were added to absorb the residual precipitant solution and prevent formation of L$_c$ phase upon injection of LCP into vacuum. The resulting crystal containing LCP sample (~10 μl) was inspected under visual and ultraviolet microscopes as well as SONICC at the LCLS and loaded in the LCP injector for LCP-SFX data collection. Samples with high crystal density were further diluted two times with LCP prepared from 1:1 ratio of 7.9 MAG and corresponding precipitant solution.

Smoothened Receptor. An engineered human smoothened receptor construct with truncated amino-terminal cysteine-rich domain (residues 1-189) and carboxy terminus at Q555, and a thermostabilized *Escherichia coli* apocytochrome B562 (BRIL) fused into intracellular loop 3 (replacing residues from P434 to K440) was generated, expressed and purified as described in the GPCR expression and purification section. The ΔCRD-SMO-BRIL-ΔC construct in complex with cyclopamine readily produced high-density microcrystals in LCP following the crystallization protocol described in the GPCR crystallization section using a variety of precipitant conditions, including 100 mM Hepes pH 7.0, 30% (v/v) PEG 400, 100 mM salt. After several rounds of optimization relatively large crystals obtained in conditions with ammonium salts were used for data collection at a synchrotron source, and microcrystals obtained in 100 mM Hepes pH 7.0, 30% (v/v) PEG 400, 100 mM NaCl were used for LCP-SFX data collection.

DgkA Expression and Purification. The coding sequence of a thermostable mutant variant of DgkA, with its N-terminal methionine replaced by a hexa-His tag-containing decagptide (MGHHHHHHEL) to facilitate purification, was synthesized and cloned. This mutant, referred to as Δ7 DgkA, incorporated seven mutations with respect to wild-type DgkA, as follows: A41C, C46A, I53V, I70L, M96L, V107D and C113A. DgkA production and purification, primarily from inclusion bodies, were carried out following published procedures.

DgkA Crystallization. Crystallization trials began with the reconstitution of the protein into the bi-layer of the lipidic cubic mesophase following a standard protocol. The protein solution at 12 mg ml$^{-1}$ was homogenized with 7.9 MAG in equal parts by volume using a coupled syringe device at room temperature (20-22° C.). Approximately 20 μl of protein-laden mesophase was transferred into a 0.5 ml Hamilton syringe containing 0.4 ml precipitant solution (0.2% (v/v) MPD, 0.1 M sodium chloride, 0.1 M sodium citrate pH 5.6) using a narrow bore coupler, as described above for GPCR crystallization. The syringe was incubated for 21 days at 20° C. for crystal growth. After separating the bathing solution from the crystal-laden LCP, excess precipitant was absorbed by mixing in 3-5 μl molten 7.9 MAG. This procedure produced optically clear LCP in which microcrystals were dispersed ready for loading into the reservoir of the LCP injector, as described above.

Experimental Setup at LCLS and Data Acquisition Rates. The experiment took place at the LCLS in the sample chamber of the Coherent X-ray Imaging repetition rate of 1-120 Hz. The pressure in the experimental chamber was ~$10^{-5}$ Torr; the pressure at the extruded LCP sample was about $10^{-1}$-$10^{-3}$ Torr depending on the gas flow rate of the sheath gas. The nozzle area is pumped by a differential pumping system, which reduces gas flow from the nozzle into the main chamber. Due to evaporative cooling, the sample temperature at the point of the X-ray interaction (100 µm downstream of the nozzle exit) is estimated to be slightly below room temperature. An XFEL beam diameter of 1.5 µm was used. With an LCLS frequency of 60-120 Hz (depending on the LCP flow rate), one million diffraction patterns, which is a sufficiently large data set to achieve atomic resolution, may be collected in ~2.5 h with 25 µl of sample.

LCP-SFX data for SMO/cyclopamine crystals were collected at an X-ray pulse-repetition rate of 120 Hz. The sample-to-detector distance was 100 mm and the beam was attenuated to 3-6% (2.5-51010 photons per pulse) of the full intensity to avoid detector saturation. A total of 3,510,525 diffraction patterns were collected, of which 274.214 were identified as potential single crystal diffraction patterns with more than 15 potential Bragg peaks by the software Cheetah, corresponding to an average hit rate of 7.8%. Auto indexing and structure factor integration of the crystal hits was performed using CrystFEL (version 0.5.1), resulting in 61,964 indexed images with a monoclinic lattice (22.6% indexing success rate). Based on the observation of systematic absences and the behaviour of the Pearson correlation coefficient, we concluded that the diffraction data reach about 3.2 Å resolution, but are highly anisotropic. The UCLA anisotropy server (http://www.services.mbi.ucla.edu/anisoscale/) was used to truncate data at 3.4, 3.2 and 4.0 Å resolution along the three principal axes. Data collection statistics are summarized in Table 1.

Structure determination and refinement. The SMO/cyclopamine structure was determined by molecular replacement with the program Phaser using the receptor domain of the previously reported SMO structure in complex with LY2940680 (PDB ID: 4JKV) and the BRIL domain from 5-HT2B structure (PDB ID: 4IB4) as the search models. After several rounds of alternate refinement by Phenix.refine, including simulated annealing to remove phase bias, and manual inspection and corrections in Coot in the absence of any ligand, extra electron density was observed in the same vicinity of the LY2940680 ligand binding site (FIG. 3). Due to the limited diffraction resolution and a relatively featureless shape of cyclopamine, orienting this ligand in the available elongated density was not straightforward and required combining additional information based on chemical knowledge to create a reasonable model. Since it has been reported that cyclopamine derivatives with bulky substitution groups attached to its secondary amine retain their ability to bind SMO25, cyclopamine was placed in the density with its secondary amine group pointing to the open extracellular space needed to accommodate bulky substitutions. After aligning the major axis of cyclopamine, two alternative orientations of cyclopamine differing by about 180° rotation around its major axis could still be placed in the available electron density. One of these orientations was selected for further refinement based on the favorable conformer energy for cyclopamine, although the second orientation could not be entirely ruled out. The obtained model containing cyclopamine was further refined resulting in $R_{work}/R_{free}$=0.232/0.278 (FIG. 6. Table 1). The structure has an excellent geometry according to the MolProbity server with 95.6% residues in the favored and 4.4% residues in the allowed Ramachandran conformations. Residues 345-354 (intracellular loop 2) and 497-504 (extracellular loop 3) were not modelled due to poor density in these regions.

The invention claimed is:

1. An injector apparatus comprising:
    a hydraulic stage having a first end and a second end, wherein the hydraulic stage comprises a housing defining a cavity between the first end and the second end of the hydraulic stage, a primary plunger disposed in the cavity and a secondary plunger;
    a pressurization system coupled to the hydraulic stage at the first end, wherein the primary plunger has a first end in fluid communication with the pressurization system and has a second end in mechanical communication with the secondary plunger;
    a reservoir bore defined in the housing of the hydraulic stage, wherein the reservoir bore has a first end and a second end, wherein the first end of the reservoir bore is configured to receive the second end of the primary plunger, wherein the secondary plunger is disposed within the reservoir bore; and
    a nozzle assembly comprising a housing, a gas tube and a nozzle capillary, wherein the gas tube has a first end, a second end and a gas aperture defined at the second end of the gas tube, wherein the nozzle capillary is partially disposed within the gas tube and is substantially coaxial with the gas tube, wherein the nozzle capillary has a first end and a second end, wherein the first end of the nozzle capillary is in fluid communication with the second end of the reservoir bore.

2. The injector apparatus of claim 1, wherein the first end of the primary plunger has a diameter in the range from about 5 mm to about 14 mm.

3. The injector apparatus of claim 1, wherein the second end of the primary plunger has a diameter in the range from about 1 mm to about 3 mm.

4. The injector apparatus of claim 1, wherein the pressurization system comprises a pressurized water reservoir coupled to a first end of a tube, wherein a second end of the tube is in fluid communication with the cavity of the hydraulic stage housing.

5. The injector apparatus of claim 1, wherein the pressurization system comprises a high pressure liquid chromatography pump coupled to a first end of a tube, wherein a second end of the tube is in fluid communication with the cavity of the hydraulic stage housing.

6. The injector apparatus of claim 1, wherein the secondary plunger comprises a plurality of Teflon balls slidably disposed within the reservoir bore, wherein the plurality of Teflon balls each have a diameter that is larger than an inner diameter of the reservoir bore.

7. The injector apparatus of claim 6, wherein the plurality of Teflon balls are deformed to be substantially cylindrical when disposed within the reservoir bore.

8. The injector apparatus of claim 6, wherein the plurality of Teflon balls each have a diameter in the range from about 1 mm to about 3 mm.

9. The injector apparatus of claim 6, wherein the inner diameter of the reservoir bore is in the range from about 1 mm to about 3 mm.

10. The injector apparatus of claim 1, wherein the nozzle capillary has an inner diameter in the range from about 10 µm to about 50 µm.

11. The injector apparatus of claim 1, wherein the nozzle capillary has an outer diameter in the range from about 100 µm to about 400 µm.

12. The injector apparatus of claim 1, wherein the nozzle capillary has a length in the range from about 1 cm to about 10 cm.

13. The injector apparatus of claim 1, wherein the nozzle capillary is made of borosilicate glass.

14. The injector apparatus of claim 1, wherein the second end of the nozzle capillary extends through the gas aperture and beyond the second end of the gas tube.

15. The injector apparatus of claim 1, wherein the second end of the nozzle capillary is cone-shaped.

16. The injector apparatus of claim 1, wherein the gas tube comprises a capillary with a square-shaped cross-section.

17. The injector apparatus of claim 1, wherein internal walls of the gas tube each have a length ranging from about 100 μm to about 400 μm.

18. The injector apparatus of claim 1, further comprising a gas inlet defined in the housing of the nozzle assembly near the first end of the gas tube.

19. The injector apparatus of claim 1, wherein the gas tube is removably coupled to the nozzle assembly.

20. The injector apparatus of claim 1, wherein the nozzle assembly is removably attached to the housing of the hydraulic stage.

21. A method for producing a continuous liquid jet, comprising:
    providing an injector apparatus according to claim 1;
    applying a first pressure to a first end of a primary plunger;
    applying a second pressure to a solution contained in a reservoir bore;
    advancing the solution into a first end of a nozzle capillary and simultaneously flowing gas through a gas tube; and
    advancing the solution out of a second end of the nozzle capillary and simultaneously flowing gas out of a gas aperture defined at the second end of the gas tube.

* * * * *